United States Patent [19]

Wieder

[11] 4,410,903
[45] Oct. 18, 1983

[54] HETEROJUNCTION-DIODE TRANSISTOR EBS AMPLIFIER

[75] Inventor: Herman H. Wieder, San Diego, Calif.

[73] Assignee: The United States of America as represented by the Secretary of the Navy, Washington, D.C.

[21] Appl. No.: 230,201

[22] Filed: Feb. 2, 1981

[51] Int. Cl.$^3$ .................... H01L 29/90; H01L 29/48; H01L 27/14; H01L 29/161
[52] U.S. Cl. ........................................ 357/29; 357/13; 357/15; 357/16; 357/22; 357/61
[58] Field of Search ................. 357/29, 16, 15, 22, 357/13, 61

[56] References Cited

U.S. PATENT DOCUMENTS

| | | |
|---|---|---|
| 2,691,076 | 10/1954 | Moore et al. |
| 3,725,803 | 4/1973 | Yoder .................... 330/46 |
| 3,922,616 | 11/1975 | Weiner .................. 330/44 |
| 3,942,132 | 3/1976 | Zinn .................. 331/94.5 H |
| 3,959,734 | 5/1976 | Gottfried et al. ......... 330/33 |
| 4,017,805 | 4/1977 | Wagner ................... 330/33 |
| 4,297,783 | 11/1981 | Casey, Jr. et al. ........ 357/16 X |
| 4,350,993 | 9/1982 | Wieder ................. 357/290 R |

OTHER PUBLICATIONS

H. Morkoc et al., "A Study of High-Speed Normally Off and Normally On Al$_{0.5}$Ga$_{0.5}$As Heterojunction gate GaAs FET's (HJFET)", *IEEE Transaction on Electron Devices*, vol. Ed.-25 No. 6 (1978) pp. 619-627.
S. Umebachi et al., "A New Heterojunction gate GaAs FET", *IEEE Transactions On Electron Devices*, vol. Ed.-22 (1976) pp. 613-614.
J. C. Campbell et al., "High Sensitivity InP/InGaAs Heterojunction Phototransistor", *Electronics Letters*, vol. 16 (1980) pp. 713-714.
J. C. Campbell et al., "InP/InGaAs Heterojunction Phototransistors", *IEEE Journal of Quantum Electronics*, vol. QE-17 (1981) pp. 264-269.

*Primary Examiner*—Andrew J. James
*Assistant Examiner*—J. Carroll
*Attorney, Agent, or Firm*—R. F. Beers; E. F. Johnston; Thomas Glenn Keough

[57] ABSTRACT

An improved apparatus modulates greater currents at higher frequencies over extended bandwidths. In addition to conventional biasing and modulation a beam of electrons is directed onto a heterojunction-diode device disposed to receive the modulating electron beam. The heterojunction diode device is fabricated from two different semiconducting materials having identical crystalline lattice structures, different fundamental energy bandgaps and different impurity types of different concentrations. This combination of properties assures greater output currents, higher frequency modulation and increased bandwidths.

3 Claims, 8 Drawing Figures

4,410,903

HETEROJUNCTION-DIODE TRANSISTOR EBS AMPLIFIER

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED PATENT APPLICATIONS

This invention is related to U.S. Pat. No. 4,350,993 by Herman H. Wieder entitled Heterojunction and Schottky Barrier EBS Targets filed June 16, 1980

BACKGROUND OF THE INVENTION

A modulated electron beam incident on a reverse-biased semiconductor p-n junction can be used to modulate the density of charge carriers and, therefore, the current flowing through the junction. The effect is similar to the modulation produced by a photon beam on a semiconductor; modulation of the photon beam produces, by means of the photoelectric effect, a modulation of the charge carrier density in the semiconductor. Electron beams with beam energies of approximately ten keV can be used to produce a substantial current gain, of the order of more than $10^3$ in semiconductor p-n junctions. This is the basis of the hybrid electron-beam semiconductor (EBS) technology.

Typically EBS structures consist of an electron-beam source, a high-frequency modulation arrangement for modulation of the electron beam and a p-n junction target all enclosed in a high-vacuum envelope. The modulation may be produced by a small potential applied to a grid which controls the e-beam current or a deflection system which moves the beam from one diode to another, when several diodes are arranged in a diode matrix array representing the target for the beam, and an output circuit connected to an external load of the EBS structure. Heretofore, the EBS device technology has been applied primarily with silicon p-n junctions as the appropriate targets in UHF and VHF amplifier configurations, a typical one being shown schematically in FIG. 1. Recent advances typified by the above reference to the related patent of Herman H. Wieder have expanded the field of EBS application to include heterojunction field effect transistors. Both the diodes and the field effect transistor modulation by EBS have been limited to the magnitudes of the output currents as well as the impressed frequency response.

SUMMARY OF THE INVENTION

The present invention is directed to providing an improved apparatus for modulating a current flow. A modulating beam of electrons is directed onto the target of a heterojunction-diode device disposed to receive the modulating electron beam to effect a higher output current flow and a higher and wider band frequency response. The heterojunction-diode device is fabricted from two different semiconducting materials having identical crystalline lattice structures, different fundamental energy bandgaps and different impurity types of different concentrations. The heterojunction-diode device optionally is configured as an asymmetric p-n heterojunction-diode fabricated from GaAs and $Ga_xAl_{1-x}As$ or as a heterojunction field effect transistor having its p-n junction gate made of GaAs and $Ga_{0.5}Al_{0.5}As$ or $In_{0.53}Ga_{0.47}As$ and InP.

It is a prime object of the invention to provide for an effective high frequency-high gain EBS amplifier of the signal impressed on a grid or high impedance electrode of an EBS structure.

Another object of the invention is to provide for high current gain in the output compared to the input of EBS structures.

Still another object of the invention is to provide for a modulating device having a greater bandwidth response.

Still another object is to provide a modulating device assuring a high signal-to-noise ratio at high frequencies and large bandwidths.

Yet a further object of the invention is to provide a heterojunction-diode device capable of handling higher power outputs and higher frequency responses than conventional homojunction diode EBS devices.

DESCRIPTION OF THE PREFERRED EMBODIMENTS

Figure 1:
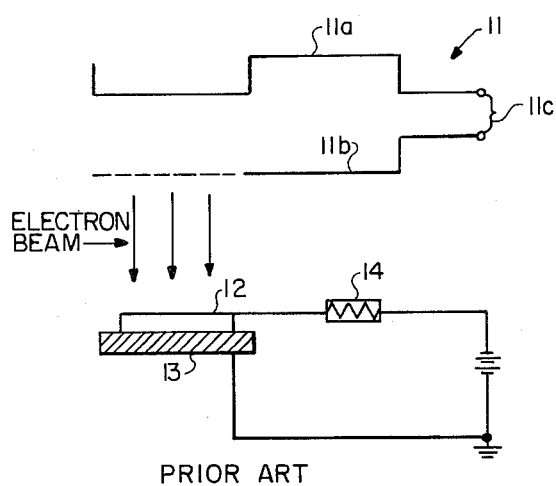
FIG. 1 depicts in schematic form an electron beam semiconductor device modified in accordance with the teachings of this inventive concept.

This invention is concerned with heterojunction diode (HJD) and heterojunction field effect transistors (HJFET) for EBS applications. A heterojunction generally is defined as the interface between two dissimilar materials. In the context of this inventive concept a heterojunction-diode defines the junction between two different semiconducting materials whose crystalline lattice structures are identical, but whose fundamental energy bandgaps are different, their impurity types are different and impurity concentrations are different. A diode, depicted in FIG. 1 is called an isotype n-p heterojunction. It is coupled in much the same manner as are silicon p-n junctions conventionally used in EBS device technology. A heterojunction-diode 12, used in accord with this inventive concept, is modulated by an electron beam source 11. The beam source includes a cathode 11a and a grid 11b that are controlled at an input 11c to modulate an electron beam in frequency and intensity. The heterojunction diode is mounted on a heat sink 13 and supplies load current to a load 14 in much the same manner as a conventional EBS device. However, a typical heterojunction-diode of the type of this inventive concept might be made between the semiconductor GaAs (gallium arsenide) and the semiconductor $Ga_xAl_{1-x}As$ (gallium aluminum arsenide). The former is a binary semiconducting alloy, the latter is a ternary semiconducting alloy whose fractional aluminum content $1-x$ can be adjusted for an exact lattice match to gallium arsenide. The gallium arsenide portion of the junction might be doped n-type using, for example, tin (Sn) and the $Ga_xal_{1-x}As$ might be doped p-type, with germanium (Ge) for example, or with zinc (Zn).

Such heterojunctions are well known and used at this time to make injection electroluminescent light emitting diodes and lasers.

Figure 2:
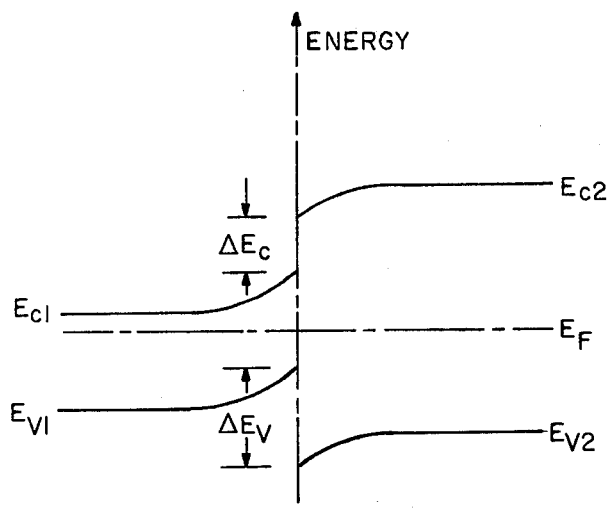
FIG. 2 depicts a typical equilibrium band structure diagram of an n-p heterojunction diode. Material on the left of the vertical dashed line has a smaller bandgap and is doped n-type; material on the right of this line is doped p-type. $E_{c1}$ and $E_{c2}$ are respective conduction band edges and $E_{V1}$ and $E_{V2}$ are valence band edges of the two materials. $E_F$ is Fermi level which is continuous across the interface. $\Delta E_c$ and $\Delta E_V$ are the conductive and valence band edge discontinuities. A forward bias or e-beam injected electrons decrease $\Delta E_c$ but leave the "notch" in $\Delta E_V$ (thus electrons can move over the barrier but holes are prevented from moving across the barrier).
Figure 3:
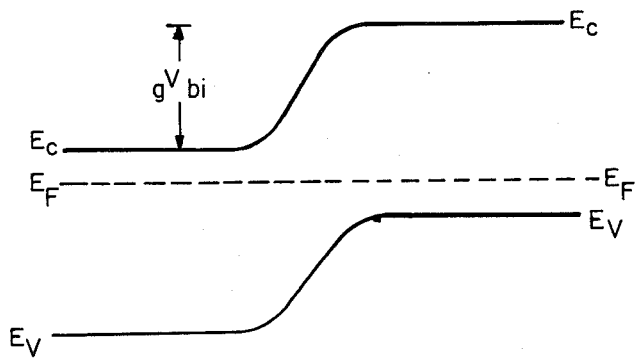
FIG. 3 shows a typical equilibrium band structure diagram of n-p homojunction-diode. $V_{bi}$ is the built-in potential of junction, and n/q is the charge on an electron. Condition of zero net electron and hole currents requires that Fermi level $E_F$ must be constant over the junction.

A typical bandstructure diagram of such an n-p heterojunction-diode is shown in FIG. 2. It is in contrast with a conventional p-n homojunction device in which both sides of the junction, that is both the n-doped and the p-doped regions are made of the same material, say gallium arsenide. A typical bandstructure diagram of a conventional p-n homojunction device is shown in FIG. 3.

One of the principle advantages of n-p heterojunction-diodes is the inherent asymmetry of the junction represented in FIG. 2 by the valance band discontinuity $\Delta E_V$. Electrons raised above the potential barrier of the junction, represented by the difference in the conduction bands, $\Delta E_V$ in FIG. 2, either because of an applied forward bias, by optical charge character injection or electron beam injection can produce a current in the diode (the latter usually may be reverse biased).

The frequency response of EBS diodes is limited by the transit time of charge carriers across the diode junction and by the frequency dependence of the load impedance in conjunction with the diode capacitance. The peak output power is limited by the diode breakdown voltage, drift velocity of the charge carriers and the space charge within the diode depletion region. For a further discussion regarding these phenomena see, for example C. B. Norris, Jr., *IEEE Transactions on Electron Devices*, ED-20, (1973) pp. 447–455.

The minimum transit time can be expressed as $$t_r \simeq 2.2 R_L C \tag{1}$$

where $R_L$ is the load resistance and C is the space-charge capacitance of the reverse biased diode junction. For a conventional p-n homojunction the space-charge capacitance C is expressed as:

$$C = \left[ \frac{1}{2} \left( \frac{N_A N_D}{N_A + N_D} \right) \cdot \left( \frac{q \epsilon_s}{V_{bi} \pm V_b} \right) \right]^{\frac{1}{2}} \tag{2}$$

For EBS application such homojunctions are deliberately made asymmetric, i.e., the donor concentration $N_D$ on one side of the junction is made much smaller than the acceptor concentration $N_A$ on the other side of the junction. Thus $$C \simeq \left[ \frac{q \epsilon_s N_D}{2(V_{bi} \pm V_b)} \right]^{\frac{1}{2}} \tag{3}$$

where $V_{bi}$ is the "built-in" potential of the junction and $\epsilon_s$ is its dielectric constant with q the electron charge; $V_b$ is the bias applied to the junction. Hence, for EBS homojunction diode applications $$t_r \simeq 1.555 R_L \left( \frac{q \epsilon_s N_D}{V_{bi} + V_b} \right)^{\frac{1}{2}} \tag{4}$$

For heterojunctions the capacitance is expressed as:

$$C = \left[ \frac{q N_D N_A \epsilon_1 \epsilon_2}{2(\epsilon_1 N_D + \epsilon_2 N_A)(V_{bi} + V'_{bi} \pm V_b)} \right]^{\frac{1}{2}} \tag{5}$$

This capacitance is smaller than that of a homojunction because the built in potential is the sum of the built in potentials of each material and the effective doping density is smaller than that of the asymmetric homojunction. Consequently, the minimum transit time of a heterojunction is smaller than that of a homojunction. This is desirable in order to extend the frequency response of EBS target diodes to high frequencies including microwaves.

The output current of an EBS diode is limited by the drift velocity of electrons and the maximum applied field while the maximum reverse bias voltage which can be applied to it is limited by the avalanche breakdown at zero current and minimum voltage drop across the diode at maximum current. The peak output current of a homojunction diode, assuming that it is biased to approximately 60 percent of its breakdown voltage is $$i_p \simeq 2 V_o \epsilon_s A \, V_b(W)/W^2 \tag{6}$$

where $v_0$ is the constant electron drift velocity, A is the surface area of the junction, and W is the space-charge width of the junction which is inversely proportional to the junction capacitance. Thus a decrease in capacitance increases $i_p$. Again a heterojunction-diode is more advantageous than a homojunction for EBS applications.

Of particular and specific interest is the higher electron velocity of III-V compound semiconducting heterojunctions. Of the various available lattice-matched heterojunction-diode structures intended EBS applications, one of the most suitable is the junction between the n-doped ternary alloy indium gallium arsenide ($In_xGa_{1-x}As$) and p-doped indium phosphide (InP). The fraction $x=0.53$ is chosen for an exact crystallographic lattice match between the ternary alloy grown by epitaxial techniques onto the acceptor-doped InP substrate.

The preparation of such heterojunction-diodes is well known in the current literature. They are at this time used principally for making photodiode detectors for fiber-optic applications. In this regard please note the article by T. P. Lee, C. A. Burrus, A. G. Dentai and K. Ogawa, in *Electronics Letters*, 16 155 (1980).

Figure 4:
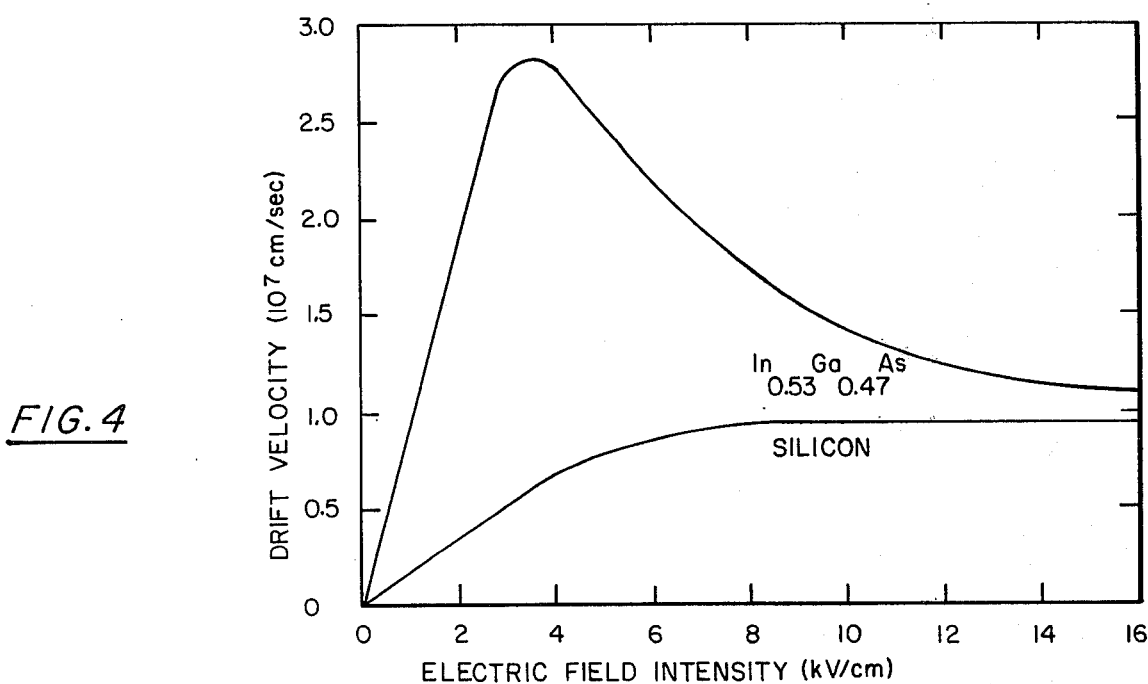
FIG. 4 shows the electron velocity of silicon compared to that of $In_xGa_{1-x}As$ as a function of electric field.
Figure 5A:
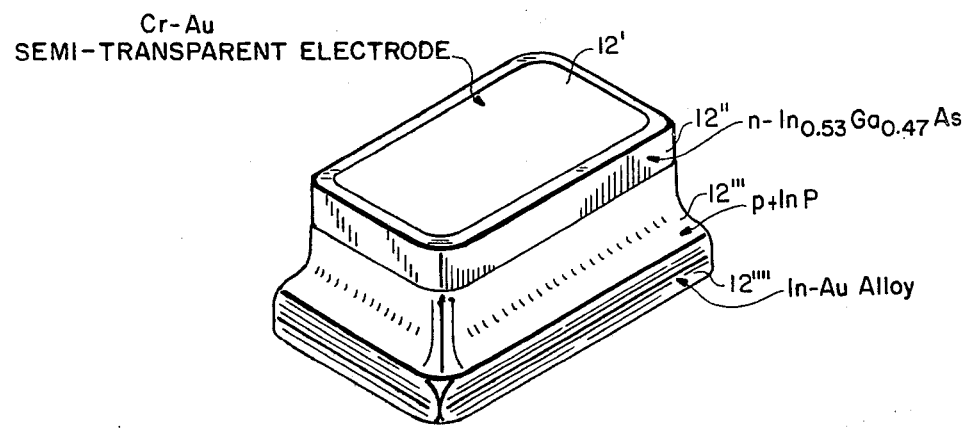
FIG. 5a schematically represents the form of a typical mesa structure.
Figure 5B:
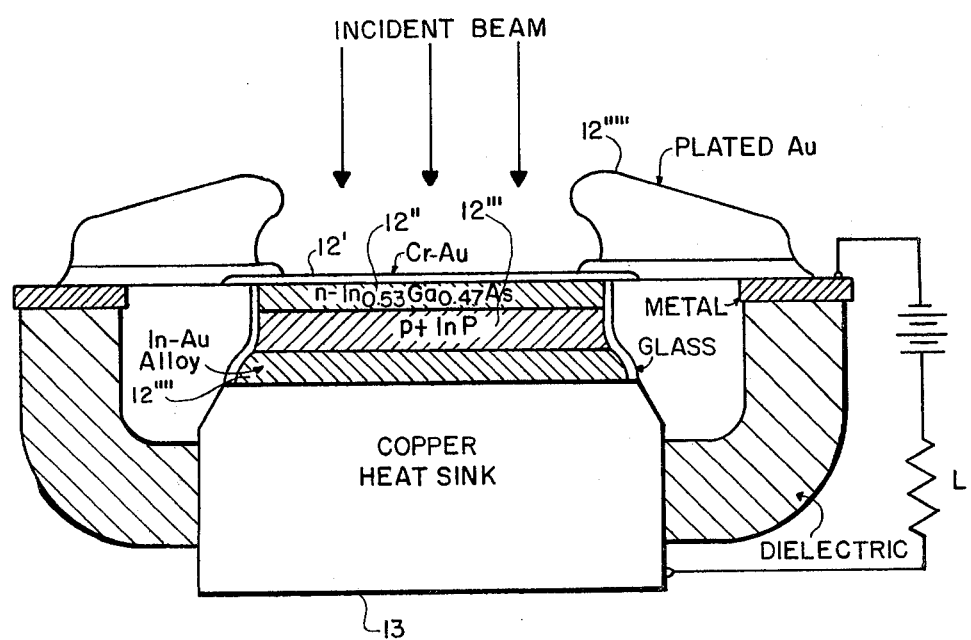
FIG. 5b depicts in greater detail a heterojunction diode target with the mesa structure of FIG. 5a in place.
Figure 6:
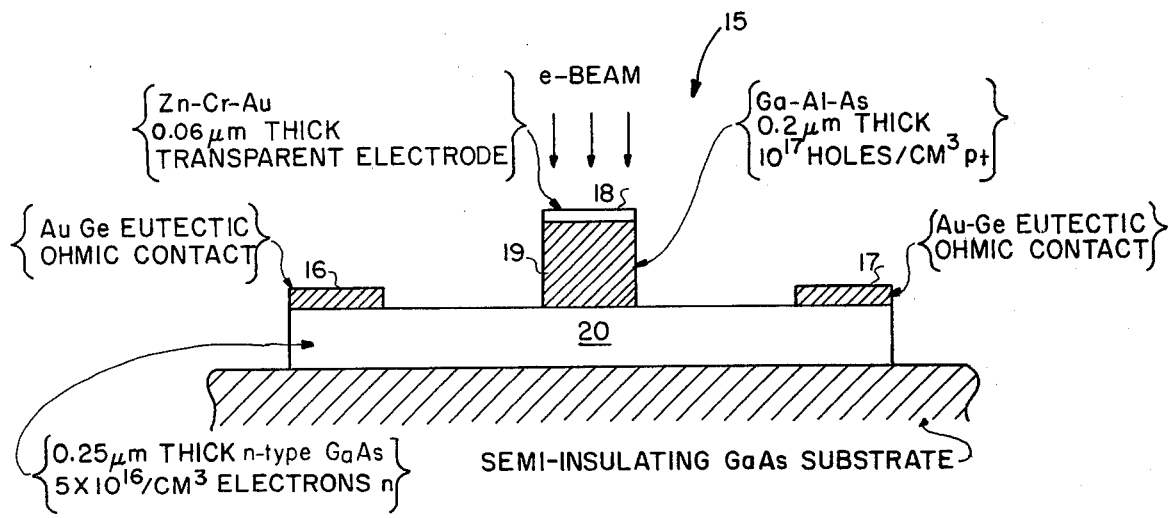
FIG. 6 is a schematic diagram of a normally-on depletion transistor.

The heterojunction-diodes have not been proposed heretofore for EBS applications. One of the specific advantages of $In_{0.53}Ga_{0.47}As$ is inherent in the high electron velocity of this compound, shown in FIG. 4, in comparison with that of silicon. The fundamental bandgap of $In_{0.53}Ga_{0.47}As$ is $E_g=0.72$ eV, that of InP is $E_g=1.35$ eV at room temperature. Doping of the former with Sn to $n=10^{17}/cm^3$ produces the n-type material. Doping InP with Zn to $p=10^{17}/cm^3$ is used to make the p-type material and the technique of growing epitaxially the $In_xGa_{1-x}As$ onto InP is well known in the art. Making the heterojunction diode with an appropriate mesa structure can appear as shown in FIG. 5a. A semitransparent Cr-Au electrode 12' is disposed over a "n" layer of $In_{0.53}Ga_{0.47}As$ 12". An adjacent "p+" layer 12'" of InP has an asymmetry in impurities to produce the specific properties of the heterojunction diode. An appropriate provision 12"" for shielding the junction edges from the electron beam is included and is described, for example, in the paper of Aris Silzars et al, "Electron Bombarded Semiconductor Devices" appearing in Proceedings of the IEEE, Vol. 62, No. 8, August 1974, pp. 1119-58. In FIG. 5b a heterojunction-diode uses an electrode 12"" made from an InAu alloy layer to fuse the mesa structure of FIG. 5a onto heat sink 13. Thus, a complete external circuit is established between the semitransparent electrode 12' plated shield 12""', the battery, heat sink 13 and electrode 12"". A glass layer optionally is included to protect the mesa structure and a dielectric enclosure is provided. The heat sink and the plated shield coupled to the Cu-An semitransparent electrode function as the electrodes for coupling to external circuit elements. Looking to FIGS. 6 and 7 a pair of heterojunction-diode field effect transistors 15 and 15' having source 16 and 16' drain 17 and 17' and gate 18 and 18' associated with the semiconductors 19 20 and 19' and 20'.

A heterojunction field-effect transistor (HJFET) whose p-n heterointerface between gate and epitaxial layer is made between semiconductors with different energy bandgaps, has been described by S. Umebachi, K. Asahi, M. Inoue and G. Kano, *IEEE Transactions on Electron Devices*, ED-22, (1975) pp. 613-4 by S. Umebachi, K. Asahi, A. Nagashima, M. Inoue and G. Kano, Japan. J. Appl. Phys., 15, (suppl. 15-1) 157 (1976) and by H. Morkoc, S. G. Bandy, G. A. Antypas and R. Sankaran, *Electronics Letters*, vol. 13 (1977) pp. 487-8. A normally-ON depletion transistor (D-HJFET) 15 is shown schematically in FIG. 6. It is made on an n-type 0.25 μm-thick GaAs epilayer 20 grown by molecular beam, vapor phase or liquid phase epitaxy on (100)-oriented semi-insulating GaAs. The layer has, typically, an electron density $n=5\times10^{16}/cm^3$ and mobility $\mu=5\times10^3 cm^2/V$-sec. A Ge-doped LPE-grown, 0.2 μm-thick, $Ga_{0.5}Al_{0.5}As$ layer with a hole concentration $p=10^{17}/cm^3$, lattice-matched to GaAs is superposed on the n-type layer.

A gate voltage applied to the gate can modulate the depletion region of the heterojunction and thus is capable of modulating the current flowing between the source and drain electrodes of the D-HJFET in a manner analogous to that of a Schottky barrier transistor. An electron beam incident on such a device will modulate the surface potential and thus provide current gain in a manner analogous to that of the EBS-Schottky barrier transistor.

Figure 7:
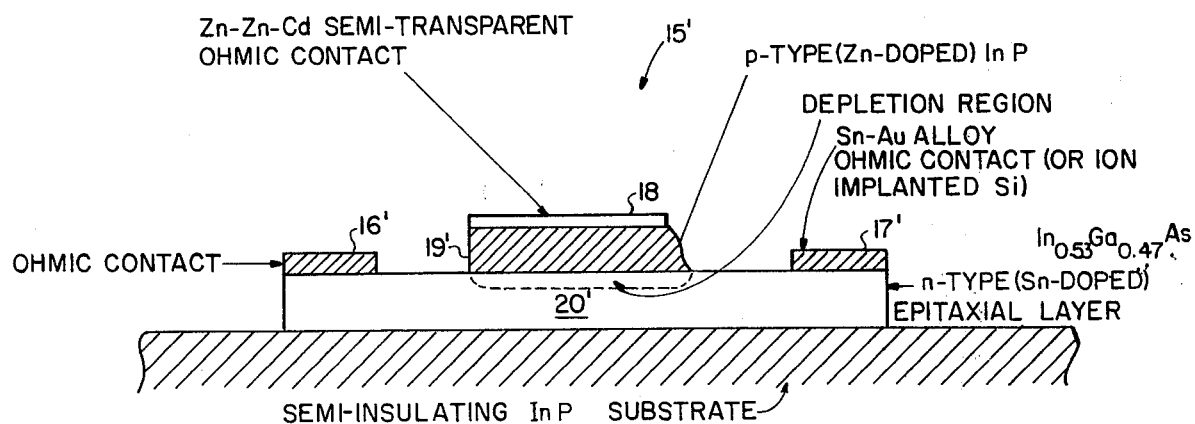
FIG. 7 shows a heterojunction FET for EBS applications.

A modified heterojunction-triode 15' employing $In_{0.53}Ga_{0.47}As/InP$ heterojunction FET for EBS applications is shown in FIG. 7 as well and functions in much the same manner as the above described $GaAs/Ga_{0.5}Al_{0.5}As$ heterojunction-diode for much the same purpose.

If the n-type GaAs layer thickness of an HJFET is reduced to 0.13 or 0.14 μm, then the junction barrier is depleted and the transistor is OFF for $V_g=0$. Such enhancement-type (E-HJFET) devices were investigated by H. Morkoc, S. G. Bandy, G. A. Antypas and R. Sankaran, *Electronics Letters*, vol. 13 (1977) pp. 747-8, and by H. Morkoc, S. G. Bandy, R. Sankaran, G. A. Antypas and R. Bell, *IEEE Transactions on Electron Devices*, vol. ED-25, (1978) pp. 619-627. Although such E-HJFET have transconductances which are 2 to 3 times smaller than those of depletion-mode devices, they require no gate voltage and thus provide a simpler EBS structure. Furthermore, the same type of structure restricted in dimension can be made using the $In_{0.53}Ga_{0.47}As$ heterojunction gate gaining an appropriate high-frequency performance because of the higher electron velocity of this alloy. Although the properties of the EBS structures proposed herewith are dependent on the material parameters and specific attributes of the binary III-V compound InP, of its ternary alloy $In_{0.53}Ga_{0.47}As$, lattice-matched to InP, the invention concept is intended to include all large direct bandgap heterojunctions with saturated electron velocities in excess of $10^7$ V/cm. Such heterojunctions are proposed herewith as EBS target diodes.

There are a number of reasons why InP heterojunctions are more appropriate semiconductor than $GaAs/Ga_{0.5}Al_{0.5}As$ heterojunctions for high-frequency EBS target applications. InP has a higher thermal conductivity than GaAs (by about 30%) even though its thermal conductivity is smaller than that of Si (by about 50%). InP devices can handle a higher power dissipation than GaAs, due to the higher thermal conductivity. The power efficiency of InP EBS diodes is likely to be essentially the same as that of GaAs; thus InP can deliver higher peak and average power output than EBS devices employing GaAs. InP has a higher saturated electron velocity than GaAs and a higher saturation velocity than Si; therefore such EBS structures can be used as microwave amplifiers well above the current gain cutoff of GaAs and Si EBS devices. The electron transit time of InP is shorter than that of GaAs; this implies that for a given distance following their generation, that electrons must drift between source and drain in an applied electric field in a FET before recombining, or for a fixed separation between source and drain electrodes of a planar transistor in which electrons drift at their saturated velocity, the frequency response and dynamic range of InP EBS devices is likely to be better than either GaAs or Si EBS devices. It is a very simple and straightforward matter to make "ohmic" contacts to n-doped InP. It is quite difficult, however, to make good ohmic contacts to n-type GaAs and to p-type InP.

Obviously, many modifications and variations of the present invention are possible in the light of the above teachings. It is therefore to be understood that within the scope of the appended claims the invention may be practiced otherwise than as specifically described.

What is claimed is:

1. An apparatus for modulating a current flow comprising:
   means for directing a modulating beam of electrons and an asymmetrical n-p heterojunction-diode having a semitransparent electrode and a second electrode, the semitransparent electrode disposed to receive the modulating electron beam, the diode fabricated from two different semiconducting materials forming a heterojunction therebetween, the materials having identical crystalline lattice structures, different fundamental energy bandgaps and different impurity types of different concentrations, the two different semiconducting materials are p+InP and n-type $In_{0.53}Ga_{0.47}As$, the $In_{0.53}Ga_{0.47}As$ material being in contact with the semitransparent electrode and the InP in contact with the other electrode.

2. An apparatus for modulating a current flow comprising:
means for directing a modulating beam of electrons and
an asymmetrical heterojunction field effect transistor provided with source and drain contacts and a gate and having its p-n heterointerface between the gate and epitaxed layer, heterointerface made between two different semiconductors disposed to receive the modulating electron beams, the semiconductors being fabricated from two different semiconducting materials forming a heterojunction therebetween having identical crystalline lattice structures, different fundamental energy bandgaps and different impurity types of different concentrations, the two different semiconducting materials are n-type GaAs and $p+Ga_{0.5}Al_{0.5}As$, the gate made up of $Ga_{0.5}Al_{0.5}As$ and a semitransparent electrode and the source and drain contacts and gate disposed on the GaAs.

3. An apparatus for modulating a current flow comprising:
means for directing a modulating beam of electrons and
an asymmetrical heterojunction field effect transistor provided with source and drain contacts and a gate and having its p-n heterointerface between the gate and epitaxed layer, the heterointerface made between two different semiconductors disposed to receive the modulating electron beams, the semiconductors being fabricated from two different semiconducting materials having identical crystalline lattice structures, different fundamental energy bandgaps and different impurity types of different concentrations, the two different semiconductor materials are n-type $In_{0.53}Ga_{0.47}As$ and p+InP, the gate made up of the InP and a semitransparent electrode and the source and drain contacts and gate disposed on the $In_{0.53}Ga_{0.47}As$.

* * * * *